(12) United States Patent
Kim

(10) Patent No.: US 7,494,848 B2
(45) Date of Patent: Feb. 24, 2009

(54) FLIP-CHIP PACKAGING OF A PHOTO-SENSOR DIE ON A TRANSPARENT SUBSTRATE

(75) Inventor: Deok-Hoon Kim, AnYang-Si (KR)

(73) Assignee: OptoPac, Inc., Gyeonggi-do (KR)

( * ) Notice: Subject to any disclaimer, the term of this patent is extended or adjusted under 35 U.S.C. 154(b) by 102 days.

(21) Appl. No.: 11/521,369

(22) Filed: Sep. 15, 2006

(65) Prior Publication Data

US 2007/0007667 A1 Jan. 11, 2007

Related U.S. Application Data

(62) Division of application No. 10/937,252, filed on Sep. 10, 2004, now Pat. No. 7,122,874.

(60) Provisional application No. 60/560,977, filed on Apr. 12, 2004.

(51) Int. Cl.
*H01L 23/31* (2006.01)

(52) U.S. Cl. .................. 438/118; 438/64; 438/456; 257/E23.132

(58) Field of Classification Search ............ 438/64, 438/66–68, 106–127, 455–459, FOR. 136–139; 257/E23.132
See application file for complete search history.

(56) References Cited

FOREIGN PATENT DOCUMENTS

JP 2001068654 A * 3/2001

* cited by examiner

*Primary Examiner*—Marcos D. Pizarro
(74) *Attorney, Agent, or Firm*—Rosenberg, Klein & Lee

(57) ABSTRACT

An electronic package for a photo-sensing device is provided. The package is formed to include a substrate of a material substantially transparent to light within a predetermined range of wavelengths. The package further formed to include at least one photo-sensing die having a photo-sensing area defined on a front side thereof. The photo-sensing die is mounted to the substrate by a plurality of interconnection joints disposed about the photo-sensing area, whereby the front side of the photo-sensing die is spaced by a gap from a front surface of the substrate. A sealing structure is formed to extend about the interconnection joints to fill portions of the gap thereabout, such that the sealing structure contiguously encloses an internal cavity in substantially sealed manner between the photo-sensing die and substrate. This internal cavity communicates with the photo-sensing area of the photo-sensing die.

5 Claims, 7 Drawing Sheets

FLIP-CHIP PACKAGING OF A PHOTO-SENSOR DIE ON A TRANSPARENT SUBSTRATE

This application is a Divisional patent application of application Ser. No. 10/937,252, filed on 10 Sep. 2004 now U.S. Pat. No. 7,122,874.

RELATED U.S. APPLICATION DATA

This Application is based on U.S. Provisional Patent Application Ser. No. 60/560,977, filed 12 Apr. 2004.

BACKGROUND OF THE INVENTION

1. Field of the Invention

The present invention relates generally to electronic packaging of semiconductor integrated circuits. More specifically, the present invention relates to electronic packaging of photo-sensing semiconductor devices having a sealing structure for protecting a photo-sensing area of one or more photo-sensing devices.

2. Related Art

Novel electronic packaging techniques for applications incorporating photo-sensors are disclosed in co-pending U.S. patent application Ser. Nos. 10/692,816, 60/507,100, 10/829,273, and 60/536,536, the disclosures of which are incorporated herein by reference. FIGS. 1-2B illustratively show schematic cross-sectional views of certain exemplary electronic packages realized by such techniques, fuller descriptions of which are contained in such co-pending applications.

The package illustrated in FIG. 1 is typically suited for general applications, while that shown in FIGS. 2A, B is particularly well-suited for cellular telephone camera module applications, where compact size remains invariably among paramount concerns.

In packages of the type shown, a photo sensor device defines a certain photo-sensing area—defined at a center portion of a top surface in the configurations illustrated. A substrate having sufficient transmittance to light within a certain wavelength range of interest is provided with the photo sensor device. The substrate may be formed, for example, of a glass material where the photo-sensor device is to sense light, within the visual range in wavelength. Electrical interconnection lines and one or more passivation layers are formed over a front surface of the substrate (bottom surface of the substrate in the configuration illustrated); and, flipchip interconnections are typically employed between the photo-sensor device and substrate. A sealing structure is also provided for protecting the side wall portion of the photo-sensor device and the photo-sensing area that it extends about. Other structures such as solder balls and decoupling capacitances are also typically provided in the resulting package using suitable means known in the art, but their detailed description is not necessary for a clear understanding of the present invention, and for that reason not included.

A highly effective yet cost-effectively realizable sealing structure is necessary for longevity and reliability in the resulting electronic package. Ideally, the sealing structure would serve to protect the given photo-sensor device from moisture uptake and prevent particulates from entering and contaminating the photo-sensing area. The structure would be configured to define a substantially sealed internal cavity about the photo-sensing area without so encroaching upon the photo-sensing area to diminish the light intensity thereat. Especially where a micro-lens structure is employed atop the photo-sensor device, the substantially sealed structure's formation of such cavity is essential for the micro-lens structure to properly intensify the light onto each photo diode underneath.

SUMMARY OF THE INVENTION

It is an object of the present invention to provide an electronic package wherein a sealing structure defining a substantially sealed internal cavity about a photo-sensing area is realized in a simple and economically efficient manner. This and other objects are attained by an electronic package formed in accordance with the present invention.

The package includes a substrate formed of a material substantially transparent to light within a predetermined range of wavelengths. The package further includes at least one photo-sensing die having a photo-sensing area defined on a front side thereof. The photo-sensing die is mounted to the substrate by a plurality of interconnection joints disposed about the photo-sensing area, whereby the front side of the photo-sensing die is spaced by a gap from a front surface of the substrate. A sealing structure extends about the interconnection joints to fill portions of the gap thereabout, such that the sealing structure contiguously encloses an internal cavity in substantially sealed manner between the photo-sensing die and substrate. This internal cavity communicates with the photo-sensing area of the photo-sensing die.

In accordance with a preferred embodiment of the present invention, each semiconductor die of the electronic package includes at least one photo-sensing area and a plurality of bonding pads formed thereon. The substrate is formed of a material sufficient transparent to light having visible wavelengths for detection by the semiconductor die. The substrate is provided with at least one patterned metal layer for forming a plurality of interconnection metal lines. The substrate is also provided with at least one patterned passivation layer for protecting the interconnection metal lines, which is formed with a plurality of openings to define substrate-side bonding pads. Such pads include at least one set of pads for forming interconnections to the photo-sensing die and at least one other set of pads for forming interconnections to external systems and/or external components, where necessary.

In accordance with a preferred embodiment, flipchip interconnections are formed in the electronic package between the photo-sensing semiconductor die and the substrate. Gaps between the photo-sensing semiconductor die and the substrate are filled substantially by the sealing structure, whereby the sealing structure is collectively disposed to extend around the photo-sensing area of the photo-sensing semiconductor die.

In accordance with another embodiment of the present invention, the sealing structure includes a dam structure formed over the passivation layer to guard against any excess sealing or other foreign material from flooding, bleeding out, or otherwise passing to areas which are to remain free of such material. In another embodiment of the present invention, a ditch structure may alternatively be formed on the passivation layer to serve similar purposes.

A sealing material employed in the sealing structure may be applied either before or after the photo-sensing device and substrate are assembled together. In various embodiments, the sealing material may be applied either on the photo-sensing die or substrate side prior to flipchip mounting or other assembly of the two sides. In such cases, a no-flow underfill material is employed for the sealing material. Alternatively, the material may be applied once the two sides are assembled and the interconnection joints therebetween formed. In that case, such materials as liquid epoxy resin may be dispensed about the interconnection joints using any suitably precise technique known and available in the art, whereupon curing is effected.

DETAILED DESCRIPTION OF THE PREFERRED EMBODIMENTS

Figure 3:
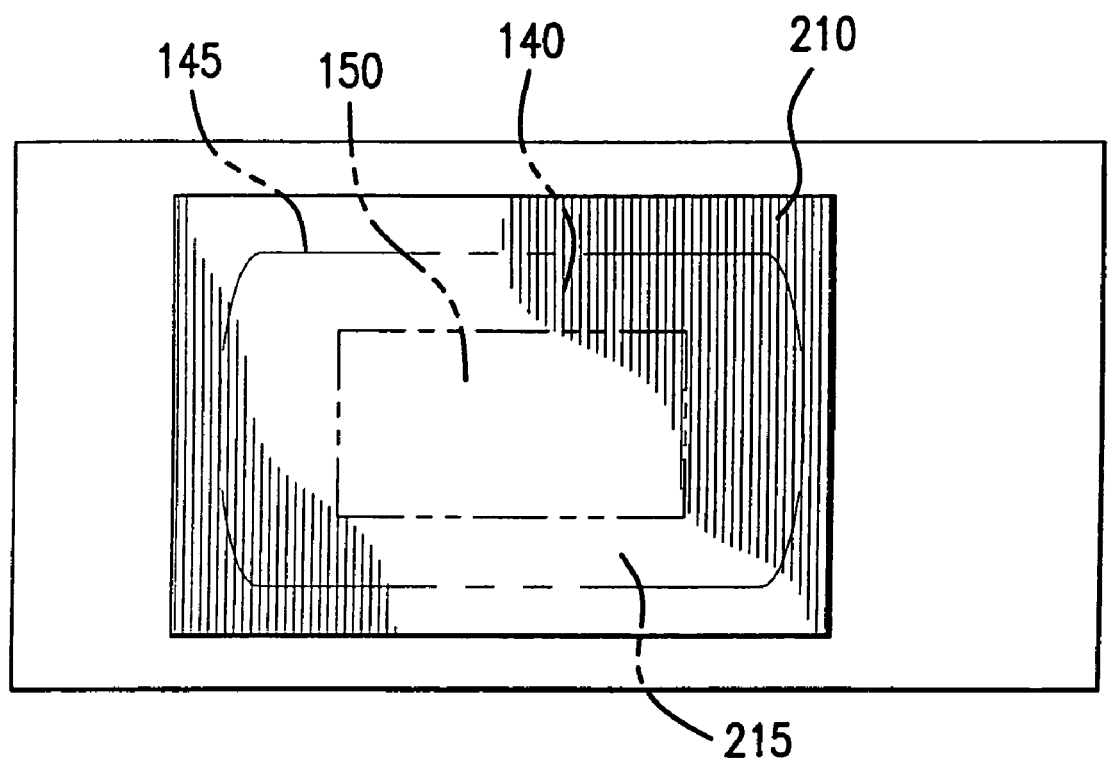
FIG. 3 is a plan view of a portion of a photo-sensing electronic package formed in accordance with one embodiment of the present invention, schematically illustrating certain regions of the substrate and photo-sensing die.
Figure 4:
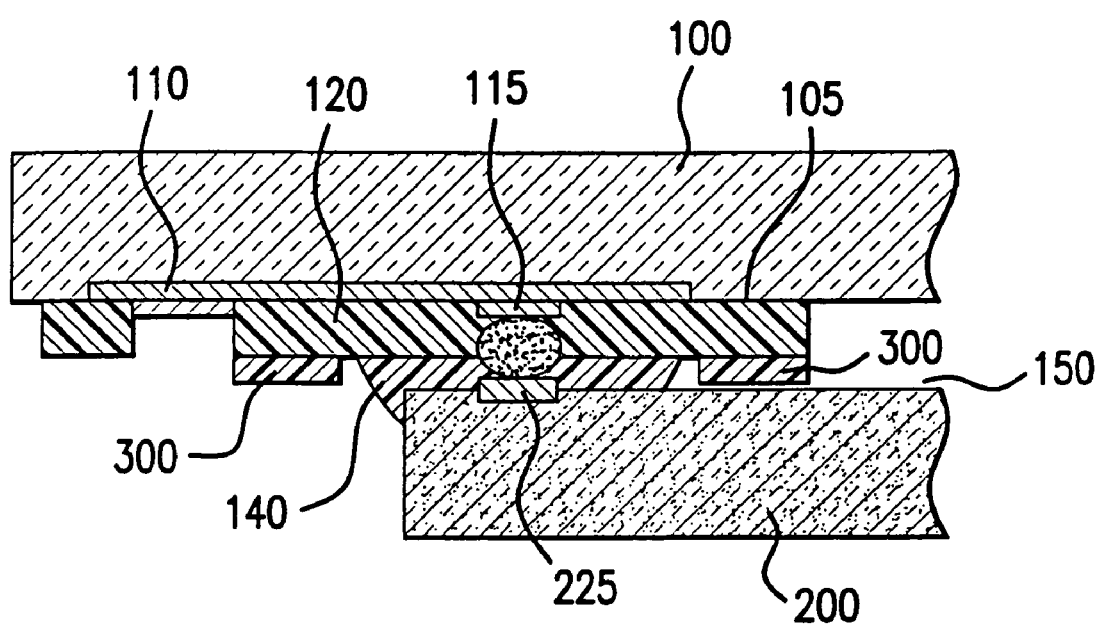
FIG. 4 is a schematic cross-sectional view of the photo-sensing electronic package embodiment illustrated in FIGS. 2A, 2B, formed with a dam structure included in a sealing structure in accordance with an embodiment of the present invention.
Figure 5:
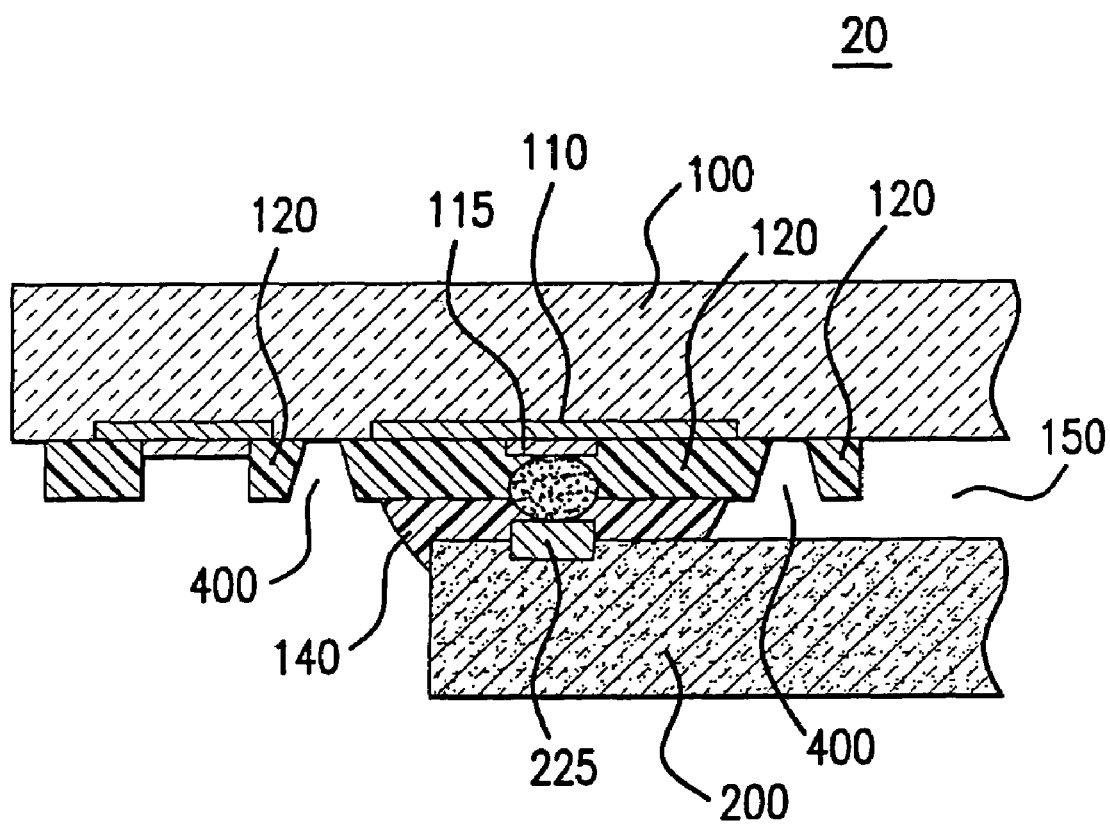
FIG. 5 is a schematic cross-sectional view of the photo-sensing electronic package embodiment illustrated in FIGS. 2A, 2B, formed with a ditch structure included in a sealing structure in accordance with an embodiment of the present invention.

Referring now to FIGS. 3-5, there are schematically shown in greater detail illustrative packages 10, 20 each having a sealing structure which includes a sealing layer 140 formed thereon in accordance with an exemplary embodiment of the present invention. In the interests of clarity and simplicity, like elements in the illustrated packages are indicated by like reference numbers. Also, details and features such as bonding pads, interconnection lines, passivation layer, may not be fully shown, in order to preserve clarity and brevity of description.

In forming each of the packages 10, 20 illustrated, a photo-sensing semiconductor wafer is typically provided with a plurality of dice, each die having appropriate integrated circuitry formed on a front surface of the wafer, and provided with a plurality of bonding pads. The wafer has formed over its front surface a patterned passivation layer for protecting the integrated circuitry underneath. Openings are provided accordingly in the patterned passivation layer at the bonding pads. Each of the resulting photo-sensing dice defames at least one photo-sensing area at its front, or light receiving, surface.

Wafer bumping is a well-known technique that has been widely used since its initial teaching, as reflected in U.S. Pat. No. 3,292,240 entitled "Method of Fabricating Microminiature Functional Components," assigned to IBM. A typical wafer bumping process includes forming at least one patterned metal layer for making flipchip bump pads connected to bonding pads on the wafer. Metallurgy used for flipchip bump pads is commonly referred to as under bump metallurgy (UBM) and typically utilizes a multilayered structure to provide multiple functions, such as good adhesion to bonding pad, good diffusion barrier against bump material, and the like.

Many bump materials are known in the art. They include Gold, Nickel, Copper, and solder alloys, which are mainly Tin-based alloys.

Various techniques are known in the art for depositing UBM. They include sputtering, electroplating, electroless plating, or the like. Also various techniques are known in the art for forming a bump. An electroplating technique is often used in forming a Gold or Copper bump, while an electroless deposition technique is often used in forming a Nickel or Copper bump. In the case of a solder alloy bump, either an electroplating technique or a printing technique is typically used.

In accordance with the present invention, the photo-sensing semiconductor wafer may preferably, though not necessarily, include UBM pads formed over the bonding pads (225 in FIGS. 4, 5), depending on the particular flipchip bumping and mounting technology actually used. Alternatively, the photo-sensing semiconductor wafer of the present invention may, if necessary, further include flipchip bumps formed over the UBM pads.

A substrate is normally fabricated separately. This substrate is preferably disposed, initially, in wafer or panel form having a large area to form a plurality of unit substrates in a batch process, in much the same manner as the semiconductor wafer is formed with a plurality of dice fabricated thereon. Generally, the substrate material preferably includes sufficient degrees of: transparency, mechanical rigidity, and chemical stability—as required by the intended application.

In the photo-sensing applications illustrated, the substrate material is substantially transparent to a particular wavelength, or a particular range of wavelengths, so as to transmit light impinging upon a back side thereof to a photo-sensing device disposed at or near its front side. Suitable substrate materials preferably include, but are not limited to, glasses, quartz, sapphire, silicon, and others, the actual choice of particular substrate material depending on the wavelength range of interest in the intended application. Exemplary applications may employ photo-sensing devices operating at wavelengths in, for instance, the x-ray, ultra-violet, visible, or infrared spectra.

The substrate material must possess not only sufficient chemical resistance and mechanical stability to withstand the temperature and processing extremes to which it would be subjected during the necessary fabrication steps, but also sufficient resistance to expected environmental factors to support the resulting devices' expected service life. A preferable substrate material for photo-sensing devices operating in the visible range of wavelengths is any suitable glass material known in the art to be adapted for optical applications. Such glass materials tend to possess suitable degrees of chemical and temperature stability, and to be readily available at reasonable cost, and from many sources.

Depending on the requirements of the intended application, the substrate may be coated with at least one thin film layer on one or more of its surfaces to enhance the light transmission therethrough. Such coating may be of the so-called anti-reflection coating (ARC) type well known to persons versed in the optical art, which serves to minimize the reflection loss of light over the entire spectrum of interest. Similarly, the substrate may be coated with at least one thin film layer on one or more of its surfaces to enhance or reduce the transmission therethrough of light at a specific range of wavelengths. Such coatings are of the "optical filtering" type also known in the art of optics. One example is an infrared (IR) cut filter coating used in much the same manner an IR cut filter glass is used for a chip-on-board (COB) cellular phone camera module.

At least one patterned metal layer 110 is formed on the front surface 105 of the substrate 100 for making electrical interconnection lines. Then at least one patterned passivation layer 120 is formed on the patterned metal layer 110 for protecting the interconnection lines defined thereby. This patterned passivation layer 120 is formed with openings for making bonding pads 115 at the substrate side. These bonding pads enable electrical interconnections to be made between the interconnection lines of the substrate 100 and the photo-sensor 200, external systems, and other components, if any.

In accordance with the present invention, the substrate 100 may preferably, though not necessarily, further include UBM pads formed over the bonding pads 115 if the bonding pads themselves are not sufficiently suitable for making flipchip bumps. Whether or not they are sufficiently suitable depends primarily upon the particular bonding pad material and flipchip technology used. Also in accordance with the present invention, the substrate may, though not necessarily, further include flipchip bumps formed over the UBM pads.

As shown in each of the embodiments of FIGS. 4 and 5, at least one photo-sensing die (or photo-sensor) 200 is mounted on a unit substrate 100, preferably by using a suitable flipchip assembly process known in the art. Flipchip assembly processes are of many suitable varieties, depending on the bump material used. In accordance with one of the most commonly used flipchip mounting processes, a flipchip joint is formed using a solder bump. With this process, a solder bumped die is placed onto a substrate having corresponding solder bump pads, then heated to the characteristic melting temperature of the solder material, with an application of flux.

Other known processes include thermo-sonic or thermo-compression bonding for joining gold bump to any suitable bonding pad. Thermo-compression bonding process may also be used with Isotropic Conductive Adhesive (ICA), Anisotropic Conductive Adhesive (ACA), or Anisotropic Conductive Film (ACF) in joining, for instance, gold, Nickel, or copper bump to any suitable bump or pad.

An electronic package 10, 20 in accordance with the present invention is not limited to any specific flipchip bump material or to any flipchip assembly process. The particular choice of such material and process will depend upon the specific requirements of the intended application.

Figure 1:
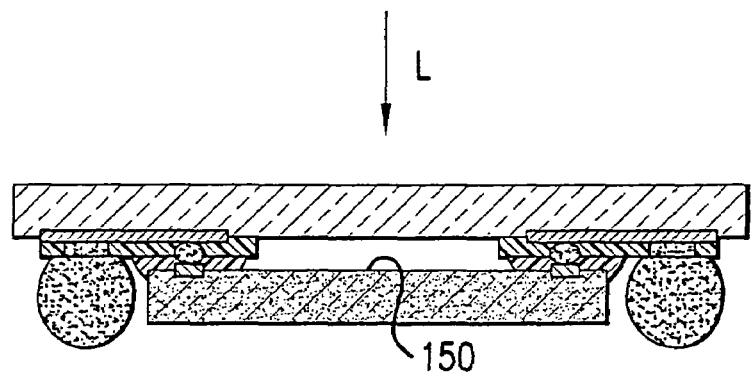
FIG. 1 is a schematic cross-sectional view of an illustrative photo-sensing electronic package as disclosed in co-pending application Ser. No. 10/692,816, shown with a sealing structure formed in accordance with the present invention.
Figure 2A:
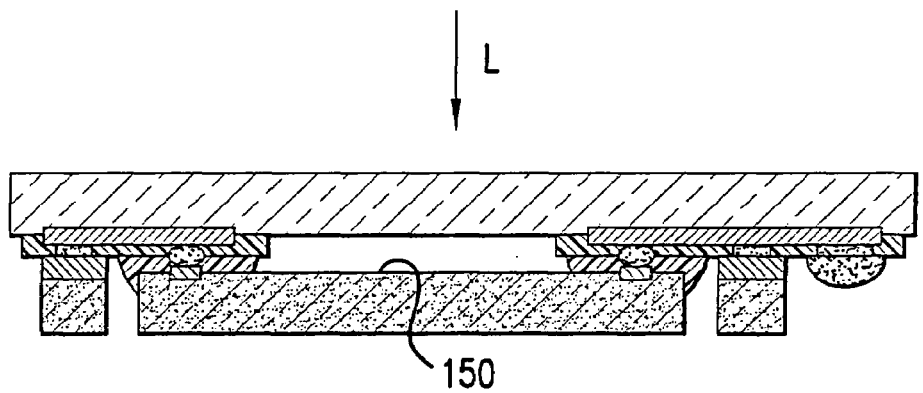
FIG. 2A is a schematic cross-sectional view of an illustrative photo-sensing electronic package as disclosed in co-pending application Ser. No. 10/892,273, shown with a sealing structure formed in accordance with the present.
Figure 2B:
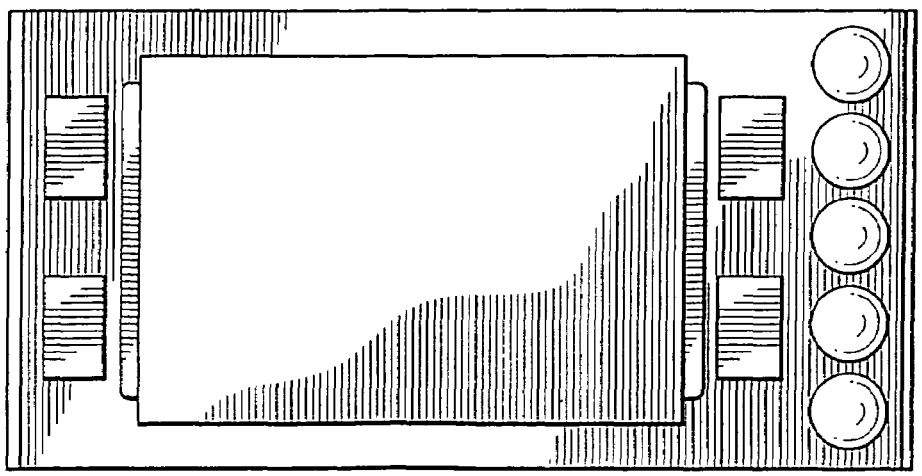
FIG. 2B is a bottom plan view of the photo-sensing electronic package embodiment illustrated in FIG. 2A.

The electronic package 10, 20 in accordance with a preferred embodiment of the present invention includes a sealing structure preferably including a sealing layer 140 disposed as shown to fill the gap between the photo-sensing semiconductor die 200 and substrate 100 about given interconnection joints (formed by a flipchip bump in the illustrated embodiments) and thereby define an enclosed cavity at the photo-sensing area 150 (see FIGS. 1, 2A, 3) of the photo-sensing semiconductor die 200.

Referring to FIG. 3, the semiconductor die 200 in the exemplary embodiment of the electronic package shown includes a peripheral area portion 210 which surrounds a central area portion 215 (where the photo-sensing die 200 extends over the substrate 100). The sealing layer 140 is formed on the peripheral area portion 210 to extend about and enclose the central area portion 215. The sealing layer 140 thus fills the gaps that would otherwise remain between the semiconductor die 200 and substrate 100 at intermediate regions from one interconnection point to another. The sealing layer 140 thereby outlines a sealed internal cavity about the photo-sensing area 150 which must be kept clear for optimal light passage.

The sealing line 145 defined by the sealing structure extends within the peripheral area portion 210 delineates the internal cavity's lateral boundary. The sealing line 145 may be of any regular or irregular contour other than that illustratively shown, so long as it loops around the photo-sensing area 150 without encroaching upon it. Preferably, this loop is formed as a substantially contiguous buffer about the photo-sensing area 150.

The sealing structure's sealing layer 140 is preferably, though not necessarily, formed of an epoxy-based resin material having a certain characteristic viscosity at application which obtains greater firmness upon curing. In accordance with the present invention, volume and positional accuracy are sufficiently controlled during application of the sealing layer material to ensure that enough sealing material is applied to form an impermeable closed loop sealing layer, while preventing too much of such material from being applied, so as to mitigate—if not altogether eliminate—the likelihood of any excess material flooding into and contaminating the photo-sensing area 150.

Epoxy-based resin materials tend to flow during application in a typical joining process. The main driving force for such material flow arises from the prevailing surface tension, such that the average rate (i.e., velocity) of a given material's flow tends to be linearly proportional to the driving force and inversely proportional to its viscosity. If excessive amounts of material are applied, the excess material will flood into neighboring areas, including the photo-sensing area if nearby. The excess material may also flood out of the photo-sensing device altogether, and migrate onto other surrounding portions of the given electronic package, detrimentally affecting those portions as well. The excess material may, for instance, contaminate a nearby bonding pad which must be kept clean for the proper later mounting of components thereon.

Even if the appropriate amount of sealing material is applied, some flow—if just of a very small amount of material—invariably occurs, potentially into unwanted areas. This is called "resin-bleed." An epoxy resin system composition typically includes numerous molecular components; and some polymer molecule components having low molecular weight tend to bleed out since the viscosity is lower than the average viscosity of the overall resin system.

Where the requirements of the intended application necessitate, the sealing structure may include preventive measures, incorporated in accordance with one aspect of the present invention in the form of retention structures. These retention structures may be configured to minimize or even prevent not only resin flooding, and resin bleeding, but also the passage of other foreign contaminants into the photo-sensing area. One such retention structure, illustrated in FIG. 4, is a dam structure 300 formed over the passivation layer 120 on the substrate side of an interconnection joint region between the substrate 100 and photo-sensing device 200 portions. One or more such dam structures 300 may be formed about the interconnection joint with sufficient height to contain the sealing structure's material and effectively serve its protective function. As illustrated, at least one dam structure 300 is preferably disposed to the inside of the interconnection joint so as to prevent migration of any sealing material onto the photo-sensing area 150. Dam structures 300 may additionally be formed to the outside of the joint's sealing structure (outside the given photo-sensing area), depending on which areas and/or components need to be kept clean.

Preferably, though not necessarily, a photo-definable polymer material is used in forming the dam structure 300. Other such suitable materials known in the art may be utilized, including an epoxy resin based material. Such so-called "dam" materials have been used in the electronic packaging art to prevent resin flooding. In one packaging technique, the dam material is first applied by dispensing. A filling material (such as the so-called "glop top coating" material) is applied inside of the resulting dam structure. In such processes, the prior-dispensed dam material serves to block the later dispensed filling material.

Preferably, the dam structure 300 is of sufficient height to block resin-flooding and bleeding for the given the type and amount of sealing material to be employed. One or more dam structure 300 may be extended in height to approach and nearly, if not actually (where permissible), contact an opposing surface of the photo sensing device 200 disposed thereover, to serve generally as an effective barrier against unwanted passage of materials into the photo-sensing area. In the embodiment disclosed, each dam structure 300 is formed with a height preferably in the approximate range of 10-50 micrometers. Though it may be of less concern than the height dimension in most applications, the width dimension is preferably within the approximate range of 20-500 micrometers. Other suitable height and width dimensions may be employed for each dam structure 300, as the precise dimensional requirements will vary with the intended applications. No particular set of height and width dimensions is required by the present invention.

One practical drawback of incorporating a dam structure in this manner is the additional cost in forming an additional layer of material, and having to carry out the additional processing steps necessitated. Depending on the requirements and available resources of the intended application, therefore, other safeguarding measures may be desirable.

Another retention structure which may be employed in accordance with one aspect of the present invention to guard against the effects of resin flooding and bleeding is a ditch structure. As shown in FIG. 5, the sealing structure may include one or more ditch structures 400 formed into the passivation layer 120 of the substrate 100. This typically requires little, if any, additional cost since the ditch structure 400 may be formed with the passivation layer 120 which serves to define it.

There is nonetheless a potential drawback to this approach. If any interconnection metal lines lie underneath the given portion of the passivation layer 120, a ditch structure formed to extend along a continuous closed loop about the interconnection joint may at some point along the loop expose the metal lines underneath. The resulting loss of passivation layer covering and protection at those points on the metal lines would likely lead to device failure. To avoid such result, it may be necessary to form broken segments of ditch structure, so that a ditch segment is formed only at those points devoid of any metal line underneath. This limits the amount of sealing material that the ditch structure(s) could safely accommodate; and, again depending on the intended application, the realizable ditch structures 400 may or may not be enough to adequately confine excess sealing material and prevent any flooding and bleeding of resin onto unwanted areas.

Like the dam structures 300, the ditch structure 400 must be deep enough and wide enough to confine excess sealing material. The depth of a ditch 400 of a particular passivation layer is limited by the thickness of the passivation layer 120 since that ditch structure 400 is patterned into such passivation layer 120. In the exemplary embodiment shown, each ditch structure's depth is preferably, though not necessarily, within the approximate range of 4-20 micrometers, the typical thickness of a polymer passivation layer. Each ditch structure's width is preferably, though not necessarily, within the approximate range of 10-100 micrometers, or more. Other suitable depth and width dimensions may be employed for each ditch structure 400, as the precise dimensional requirements will vary with the application intended. No particular set of depth and width dimensions is required by the present invention.

There are many different sealing materials known in the art, and various methods by which they may be applied. One example in accordance with a preferred embodiment of the present invention is to use a no-flow underfill material as the sealing material. This is most viable in practice when solder joints are used for making interconnections between the substrate 100 and the photo-sensing device 200.

No-flow underfill materials are generally well-known to those skilled in the flipchip assembly art. They are epoxy resin based materials having reactive components which are used in certain applications to react with metal oxide in order to remove it from a joining surface. That is a particularly advantageous feature of solder flux, the so-called "no-clean flux," which is a resin based flux.

Notably, a no-flow underfill material not only exhibits fluxing action, it also fills the given joining area and thereby provides mechanical strength, much as an "underfill" material generally would. In contrast, underfill materials (of a type other than no-flow), while they also are epoxy resin based materials, do not exhibit fluxing action. These materials, too, are well-known to those skilled in the electronic packaging art.

Figure 6:
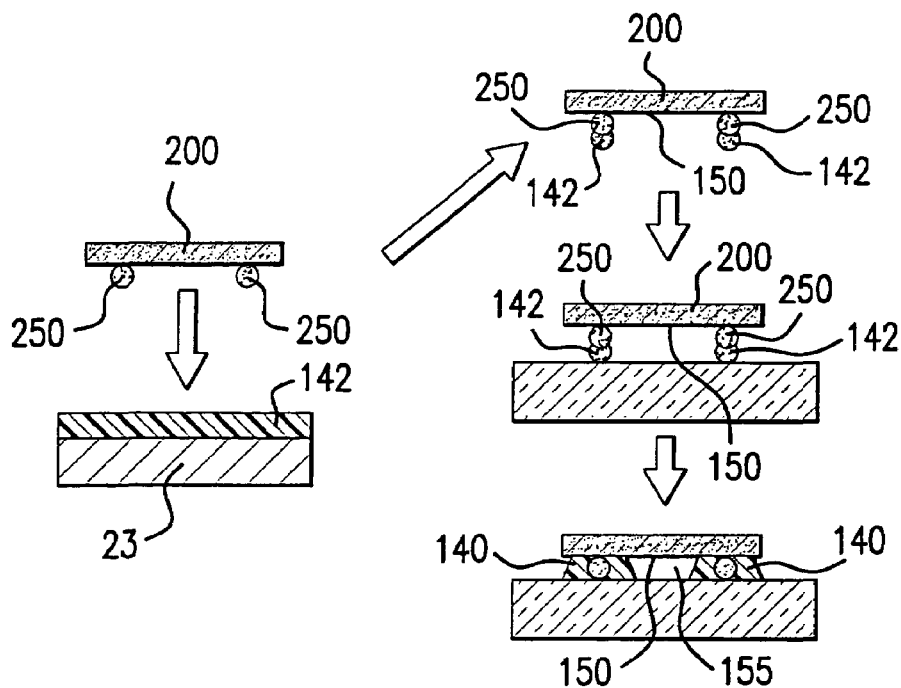
FIG. 6 is a schematic diagram illustrating a sequence of processing steps for forming at least a portion of a sealing structure in accordance with an embodiment of the present invention.

Referring now to FIGS. 6-8B, certain details and features such as bonding pads, interconnection lines, passivation layer, and the like are not shown, in order to preserve clarity and brevity of description. Dipping is a common flipchip mounting method also well known to those skilled in the flipchip mounting art. In one example of a suitable application method that may be employed in accordance with the present invention, a pre-selected no-flow underfill material is applied by "dipping" a portion of a bumped photo-sensing device 200 therein, as illustrated in FIG. 6.

In the method illustrated, the flipchip bumps 250 of the bumped photo-sensing device 200 are dipped into a table device of a suitable type known in the art, in which a layer of uncured no-flow underfill material 142 is provided at a substantially uniform thickness (or depth). Transfer of a certain amount of no-flow underfill material 142 onto the bottom of each protruded flipchip bump 250 then occurs upon this dipping, much as in a "pin transfer" type process known in the art. The photo-sensing device 200 is next placed onto its substrate 100. At an appropriate characteristic solder reflow temperature, the solder material at the point of interconnection melts and forms solder joint connections between the photo-sensing device 200 and substrate 100, while the no-flow underfill material 142 cures to form the sealing layer 140 thereabout.

In accordance with one aspect of the present invention, the no-flow underfill material 142 at adjacent yet mutually offset points of interconnection come together upon curing, such that the sealing layer portions 140 formed respectively thereabout are integrally connected. A substantially contiguous sealing layer thus results along the path defined by a series of interconnection points, though the interconnection points themselves may be spaced apart. In the given embodiment, interconnection points describe on the photo-sensing device 200 a closed loop about the given photo-sensing area 150; consequently, the sealing layer portions cured at the interconnection points collectively form a contiguously looped sealing layer enclosing an internal cavity 155 at that photo-sensing area 150.

In an embodiment employing a common planar dipping station, as illustrated in FIG. 6, the uncured no-flow underfill material 142 must be maintained on the table 23 at a thickness (or depth) less than the bump height of the photo-sensing device 200. Otherwise, the photo-sensing area 150 at the center of the photo-sensing device 200 could be contaminated with the no-flow underfill material 142 during the dipping process. If the requirements of the given application are such that this limitation on the thickness/depth of the dipping station's uncured sealing material 142 would prove too restrictive to ensure sufficient transfer of the material, an alternate application method, like that illustrated for example in FIG. 7, may be employed.

Figure 7:
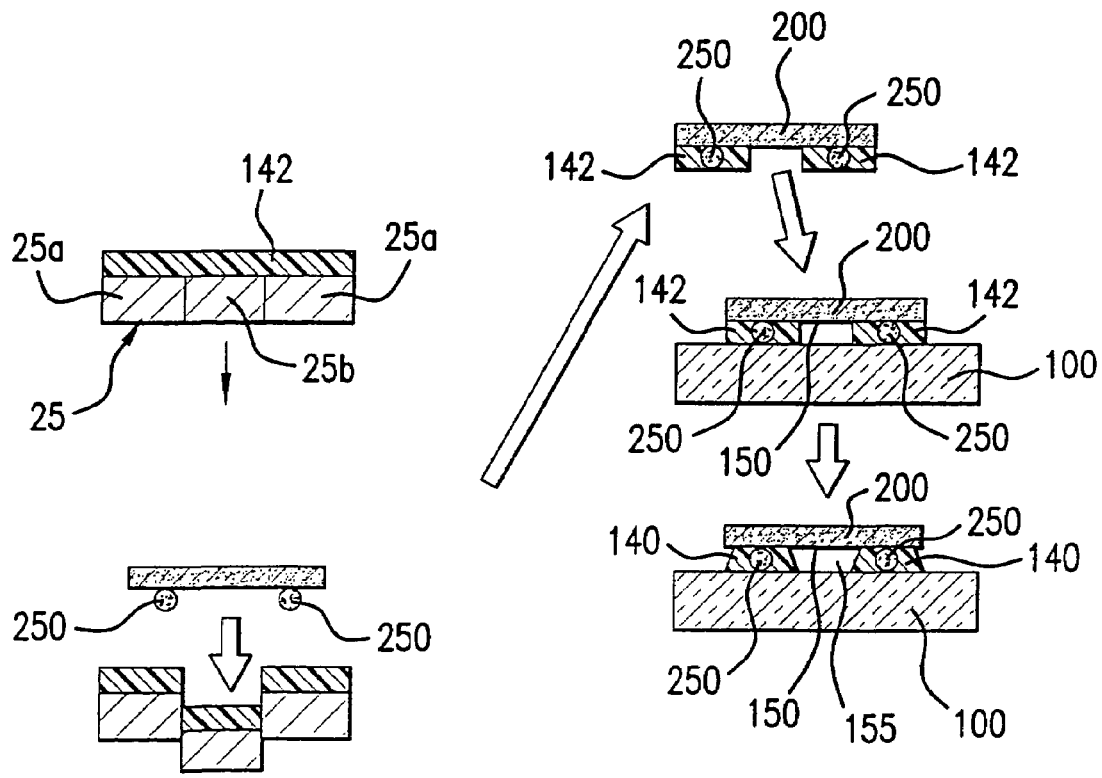
FIG. 7 is a schematic diagram illustrating a sequence of processing steps for forming at least a portion of a sealing structure in accordance with another embodiment of the present invention.

Referring to FIG. 7, a dipping station 25 is shown having two parts 25a, 25b assembled together for holding the uncured sealing material 142. In the exemplary configuration shown, the dipping station 25 includes an outer part 25a, and a center part 25b that is downwardly displaceable relative to the outer part 25a during each dipping operation. This center part 25b is configured to match the photo-sensing area 150 of the photo-sensing device 200, so that when the center part 25b is displaced downward during the dipping operation, the photo-sensing area 150 remains clean and free of contamination. Throughout the dipping operation, the photo-sensing area 150 is kept safely apart from that portion of the sealing material 142 immediately opposing it (the portion held on the central part 25b).

Using the exemplary methods illustrated in FIGS. 6 and 7, the cavity 155 that results in the electronic package at the photo-sensing area 150 is preferably, though not necessarily, of a height within the approximate range of 30-50 micrometers. The flipchip bumps 250 are preferably, though not necessarily, at a height at least initially of approximately 5-80 micrometers. The gap filled by the sealing layer 140 would normally be less than the cavity 155 in height, since at least one patterned metal layer and at least one passivation layer occupy a portion of the total space between the substrate 100 and photo-sensing device 200 at the gap. The gap height may, for example, lie in the given embodiment within a range of approximately 5-45 micrometers.

Also in the exemplary application methods illustrated in FIGS. 6 and 7, the thickness/depth of the uncured no-flow underfill material 142 provided at the dipping station may be within a approximate range of 25-100 micrometers for the given embodiment. The total volume of no-flow underfill material 142 may be controlled, obviously, by varying the thickness/depth of that no-flow underfill material 142 maintained on the dipping station table.

The exemplary methods illustrated in FIGS. 6 and 7 apply the uncured no-flow underfill material 142 on the photo-sensing device side prior to assembly with the substrate side, then effect concurrent curing while forming the solder joints upon assembly with the substrate side. In alternate methods, however, the uncured no-flow underfill material may be first applied onto the substrate side rather than the onto the photo-sensor side. Many techniques are known in the art in that regard. They include ink jetting, ultrasonic spraying, needle dispensing, tampon printing, pin transfer, screen or stencil printing, and the like.

Figure 8A:
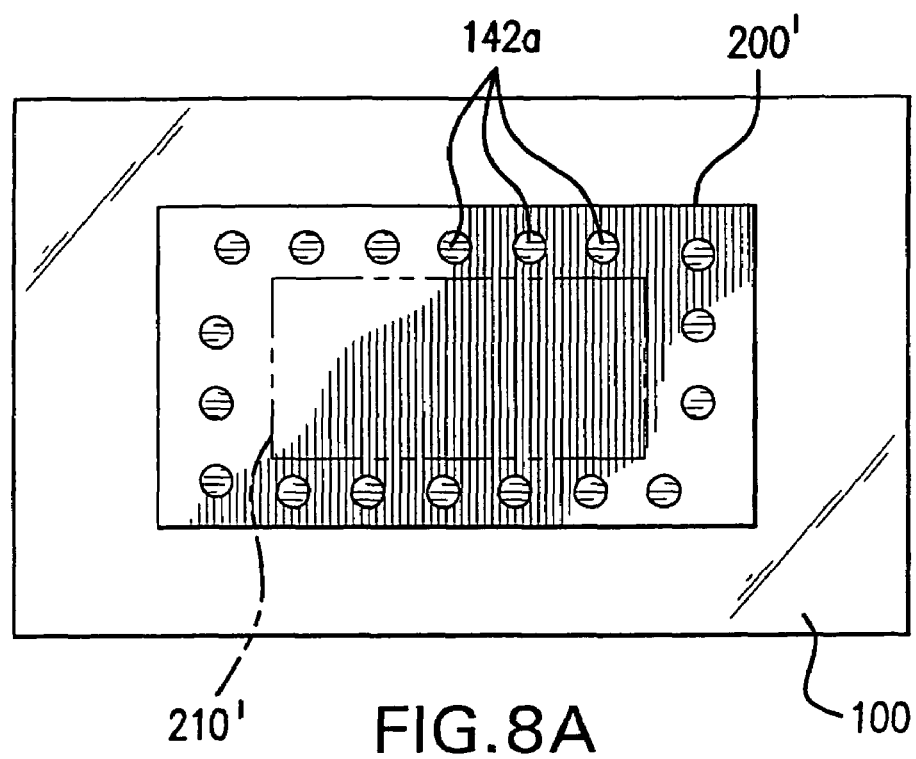
FIG. 8A is a plan view of a portion of a photo-sensing electronic package formed in accordance with one embodiment of the present invention, schematically illustrating an exemplary intermittent pattern of sealing material applied onto the substrate prior to curing.
Figure 8B:
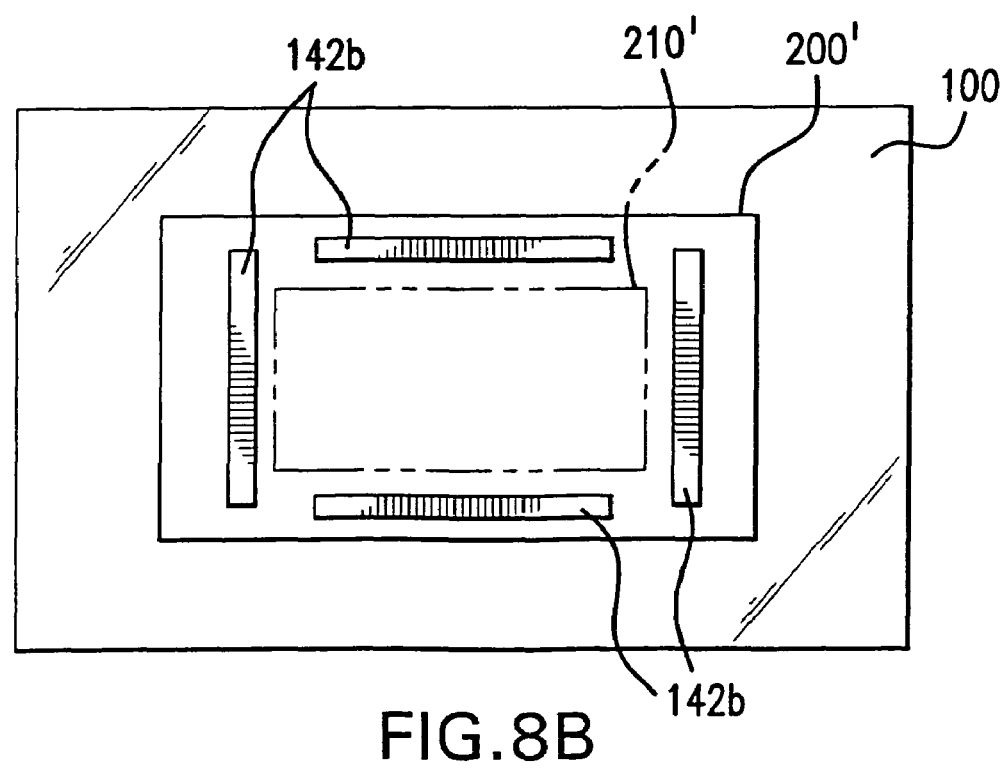
FIG. 8B is a plan view of a portion of a photo-sensing electronic package formed in accordance with one embodiment of the present invention, schematically illustrating another exemplary intermittent pattern of sealing material applied onto the substrate prior to curing.

As shown in the illustrative example of FIGS. 8A, 8B, the uncured sealing material 142 may be applied on the substrate 100 in a series of 'dots' 142a or a series of 'strips' (or line segments) 142b patterned about the photo-sensing area 210' (as projected onto the substrate), in order to create a closed loop sealing layer 140 after flipchip assembly. The dots 142a and strips 142b are each applied outside the projected photo-sensing area 210', but preferably inside the photo-sensing device's projected outline 200'. The application patterns shown are purely illustrative, and various other suitable approaches may be employed in accordance with the present invention, including a combination of the two illustrated, wherein both dots 142a and strips 142b of uncured sealing material are applied to the substrate about the area 210'.

Commercially available no-flow underfill materials typically exhibit a viscosity of about 10-30 Pa-sec at room temperature. Equipment known in the art are presently capable of applying a no-flow underfill material at dot diameters or strip widths as low as about 300 micrometers, while maintaining sufficient degree of application volume and position control for most applications. The volume of applied no-flow underfill material may be controlled by varying one or more of the dot diameter, the strip width, and the space between dots 142a and/or strips 142b.

In a preferred embodiment of the present invention, the no-flow underfill material 142 is preferably applied onto the appropriate sealing area on the substrate side in a series of dots 142a or strips 142b as illustrated in FIGS. 8A, 8B, or a combination thereof. Preferably, though not necessarily, the dots 142a or strips 142b are applied with a dot diameter or strip width, whichever is applicable, within the range of approximately 200-500 micrometers.

ACA or ACF materials may be used in various embodiments of the present invention to join Gold, Copper, or Nickel bumps with corresponding bumps or pads, in any suitable manner known in the art. ACA and ACF include epoxy resin materials having electrically conductive particles, and are typically used in the flipchip mounting of flipchip dice having Gold, Copper, or Nickel bumps. In the case of ACA, the ACA material is applied in much the same as the no-flow underfill material is applied, as it too is normally a liquid state epoxy resin based material. In the case of ACF, the ACF material is applied onto the substrate side using a suitable tape mounting approach known in the art.

The given photo-sensing die 200 is thereafter mounted onto the substrate using a suitable thermo-compression bonding process known in the art. An electrical joint is thus created, while at the same time, the thermo-compression causes the sealing material 142 to cure to its sealing layer 140. In a typical application, the tape mounting process includes thermo-compression for approximately 1-5 seconds at 60-100 degree C. with 0.1-0.8 MPa. Flipchip mounting processes typically include thermo-compression for approximately 5-10 seconds at 180-200 degree C. with 50-150 MPa.

Figure 9A:
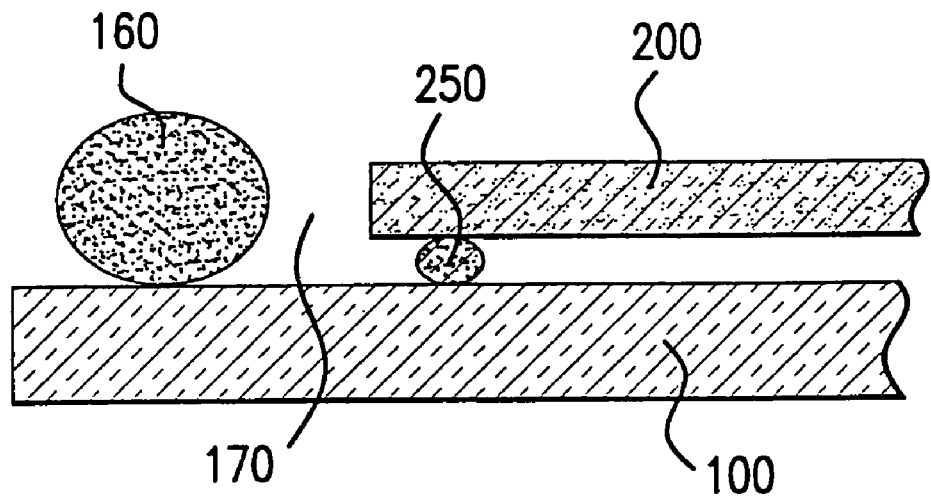
FIG. 9A is a sectional view of a portion of a photo-sensing electronic package shown, in accordance with yet another embodiment of the present invention, prior to dispensing of sealing material thereon; and, FIG. 9B is a sectional view of the portion of a photo-sensing electronic package shown in the embodiment of FIG. 9A, schematically illustrating the dispensing of a sealing material about an interconnection joint.
Figure 9B:
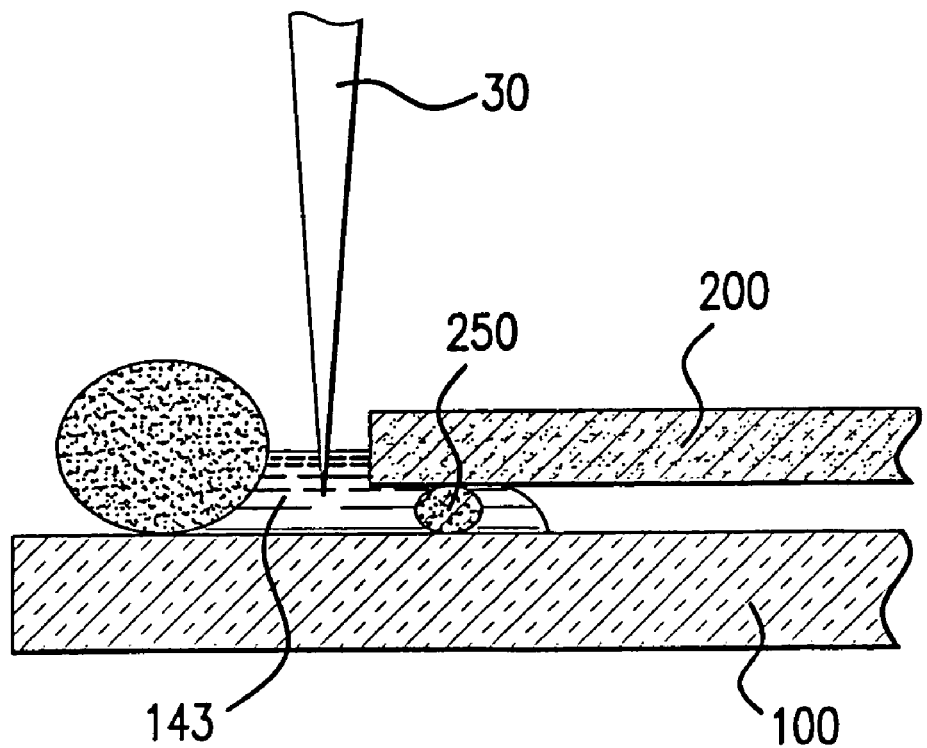

In other alternate approaches to sealing material application, the material may be applied to appropriate areas in situ, even after the photo-sensing device and substrate sides are joined together. One example of such alternate approach may include the use of a needle dispensing technique to surgically locate the uncured sealing material 142 immediately around the interconnection points of a prior-mounted photo-sensing die 200. Such exemplary approach is very generally illustrated in FIGS. 9A and 9B, in which details and features such as bonding pads, interconnection lines, passivation layer, and the like are, in the interests of clarity and brevity, not shown.

With this approach, any suitable liquid epoxy resin material known in the art may be used, for adjacent structures are in place to serve containment functions, and contamination of exposed bump and pad portions not a concern. The approach may accordingly provide practical advantages like greater ease and simplicity over other approaches prescribing the use of a no-flow underfill material. Nonetheless, a main drawback to this approach is the requisite amount of work space 170 around the flipchip mounted photo-sensing device 200 to accommodate a dispensing needle 30. This work space 170 must provide sufficient clearance for the dispensing needle 30 to gain access and apply the uncured sealing material 143 to the appropriate areas immediately surrounding the given interconnecting joints.

Minimum needle sizes currently available are typically on the order of about 150 micrometers in inner diameter, with minimum needle wall thicknesses typically on the order of about 75 micrometers. Given the practical limits of high precision equipment placement at about +/−12 micrometers in positional accuracy, a work space 170 (between the photo-sensing die 200 and adjacent structures such as a neighboring bump or pad 160 and/or the substrate 200) providing a clearance of at least about 350 micrometers would be necessary to safely and effectively accommodate needle dispensing. If the given application requires a very compact electronic package, as is the case in most hand-held applications, this may be a prohibitive factor. Otherwise, where the intended application permits, the approach may represent the simplest and most practicable means for creating the desired sealing layer 140. Numerous liquid epoxy resin materials are commercially available for use in that event, which have viscosities ranging approximately 3-50 Pa-sec.

The unique package formed in accordance with the present invention is applicable to all types of photo sensors or photo detectors fabricated with various types of technologies known in the art, such as CCD or CMOS. The present invention is applicable wherever area image sensors are used, such as in camcorders, digital still cameras, PC cameras, mobile phone cameras, PDA and handheld cameras, security cameras, toys, automotive equipment, biometrics, and the like. The present invention is also applicable to linear array image sensors such as those used in fax machines, scanners, bar code readers and scanners, digital copiers, and the like. It is equally applicable in packaging non-imaging photo-sensors such as single diode or four-quadrant diodes used in motion detectors, light level sensors, positional or tracking systems, and the like. Additionally, the present invention is applicable to other general electronic packages that require sealing only at particular predetermined areas.

Although this invention has been described in connection with specific forms and embodiments thereof, it will be appreciated that various modification other than those discussed above may be resorted to without departing form the spirit or scope of the invention. For example, equivalent elements may be substituted for those specifically shown or described, certain features may be used independently of other features, and in certain cases, particular combinations of fabrication or assembly steps may be reversed or interposed, all without departing from the spirit or scope of the invention as defined in the appended Claims.

What is claimed is:

1. A method of fabricating a photo-sensing device package comprising the steps of:
   (a) establishing a substrate formed of a material substantially transparent to light within a predetermined range of wavelengths, said substrate having a front surface;
   (b) forming on said substrate front surface at least one set of patterned metal and passivation layers defining a plurality of bonding pads;
   (c) establishing at least one photo-sensing die having at least one photo-sensing area defined on a front side thereof;
   (d) forming on said photo-sensing die front side a plurality of bonding pads disposed peripherally outside said photo-sensing area;
   (e) forming a plurality of flipchip bumps for respective ones of said bonding pads at said photo-sensing die front side;
   (f) dipping said flipchip bumps of said photo-sensing die into an uncured epoxy resin based material of no-flow underfill type;
   (g) flipchip mounting said photo-sensing die and substrate one onto the other to form a plurality of interconnection joints disposed about said photo-sensing area, whereby said front side of said photo-sensing die is spaced by a gap from said front surface of said substrate; and,
   (h) forming on said passivation layer formed in step (b) a sealing structure for substantially filling the gap to establish a closed loop configuration contiguously enclosing said photo-sensing area in substantially sealed manner, whereby an internal cavity is defined thereat between said photo-sensing die and substrate,
   wherein said no-flow underfill type material cures at step (g) during said formation of said interconnection joints.

2. The method of fabricating a photo-sensing device package as recited in claim 1, further comprising in step (h) the step of forming a dam structure to protrude from said passivation layer and extend contiguously about said internal cavity.

3. The method of fabricating a photo-sensing device package as recited in claim 2, wherein said dam structure is formed by a photo-definable polymer material disposed on said passivation layer.

4. The method of fabricating a photo-sensing device package as recited in claim 1, further comprising before step (e) the step of applying an uncured epoxy resin based material of no-flow underfill type on said substrate front surface, said no-flow underfill material being applied in an intermittent pattern about a central area portion of said substrate front surface, and curing said no-flow underfill type material at step (f) during said formation of said interconnection joints to form a sealing layer for said sealing structure.

5. The method of fabricating a photo-sensing device package as recited in claim 4, wherein said uncured no-flow underfill material is applied in a series of spaced drops, each said drop being shaped as one of: a dot or an elongate strip; adjacent ones of said drops being integrally joined upon curing at step (f).

* * * * *